(12) United States Patent
Yoshimizu et al.

(10) Patent No.: US 8,865,563 B2
(45) Date of Patent: Oct. 21, 2014

(54) FILM EMBEDDING METHOD AND SEMICONDUCTOR DEVICE

(71) Applicant: Kabushiki Kaisha Toshiba, Tokyo (JP)

(72) Inventors: Yasuhito Yoshimizu, Mie (JP); Hisashi Okuchi, Kanagawa (JP); Hiroshi Tomita, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 26 days.

(21) Appl. No.: 13/787,269

(22) Filed: Mar. 6, 2013

(65) Prior Publication Data

US 2013/0249062 A1  Sep. 26, 2013

(30) Foreign Application Priority Data

Mar. 23, 2012  (JP) ................. P2012-068439

(51) Int. Cl.
| | |
|---|---|
| *H01L 21/76* | (2006.01) |
| *H01L 23/24* | (2006.01) |
| *H01L 21/02* | (2006.01) |

(52) U.S. Cl.
CPC .......... *H01L 21/02304* (2013.01); *H01L 23/24* (2013.01)
USPC ........................................................ 438/445

(58) Field of Classification Search
CPC .................. H01L 21/02304; H01L 21/76224; H01L 21/76264; H01L 23/24
USPC .................... 438/424, 427, 437, 445
See application file for complete search history.

(56) References Cited

U.S. PATENT DOCUMENTS

| | | | |
|---|---|---|---|
| 2006/0115982 A1 | 6/2006 | Morisue et al. | |
| 2006/0128142 A1 | 6/2006 | Whelan et al. | |
| 2007/0273044 A1 | 11/2007 | Yang et al. | |
| 2012/0049320 A1* | 3/2012 | Parsey et al. | 257/528 |
| 2012/0187522 A1* | 7/2012 | Aquilino et al. | 257/506 |

FOREIGN PATENT DOCUMENTS

| | | |
|---|---|---|
| JP | 06-283515 | 10/1994 |
| JP | 07-099191 | 4/1995 |
| JP | 2003051538 A | 2/2003 |
| JP | 2007318141 A | 3/2012 |

OTHER PUBLICATIONS

Japanese Office Action dated Jun. 16, 2014, filed in Japanese counterpart Application No. 2012-068439, 8 pages (with translation).

* cited by examiner

*Primary Examiner* — Brook Kebede
(74) *Attorney, Agent, or Firm* — Patterson & Sheridan, LLP (57) ABSTRACT

A method of forming an embedded film comprises depositing a first layer on a second layer that is disposed on a substrate and includes a material different from materials included in the first layer, forming an aperture through the first layer and into the second layer, the aperture having a side surface that includes an exposed portion of the first layer and an exposed portion of the second layer, bringing a material that includes organic molecules into contact with the exposed portion of the first layer and the exposed portion of the second layer to form a monomolecular film that covers the side surface, and forming the embedded film in the aperture with a material having a high enough affinity to the monomolecular film to substantially fill the aperture.

20 Claims, 9 Drawing Sheets

FILM EMBEDDING METHOD AND SEMICONDUCTOR DEVICE

CROSS-REFERENCE TO RELATED APPLICATION

This application is based upon and claims the benefit of priority from Japanese Patent Application No. 2012-068439, filed Mar. 23, 2012; the entire contents of which are incorporated herein by reference.

FIELD

Embodiments described herein relate to a film embedding method and a semiconductor device.

BACKGROUND

In the manufacture of semiconductor devices, patterns that are formed on a semiconductor substrate have been increasingly miniaturized, causing difficulty in embedding metal films or insulating films into the concave portions of such patterns. It is especially difficult to embed a metal film or an insulating film in cases where a pattern of a concave portion is formed in a film stack in which films containing different materials are laminated because the reactivity and the wettability of the materials constituting the side surface of the concave portion are different. This hinders the miniaturization of a semiconductor device.

DETAILED DESCRIPTION

Embodiments provide a film embedding method and a semiconductor device made from the method that can achieve miniaturization.

In general, the present invention according to embodiments will be explained with reference to the figures.

In one embodiment, a method of forming an embedded film comprises depositing a first layer on a second layer that is disposed on a substrate and includes a material different from materials included in the first layer, forming an aperture through the first layer and into the second layer, the aperture having a side surface that includes an exposed portion of the first layer and an exposed portion of the second layer, bringing a material that includes organic molecules into contact with the exposed portion of the first layer and the exposed portion of the second layer to form a monomolecular film that covers the side surface, and embedding the aperture with a material having a high enough affinity to the monomolecular film to substantially fill the aperture and form the embedded film.

In addition, according to another embodiment, a semiconductor device comprises a first layer disposed on a second layer that is disposed on a substrate and includes a material different from materials included in the first layer, an aperture formed through the first layer and into the second layer, the aperture having a side surface in contact with a portion of the first layer and a portion of the second layer, a monomolecular film that is formed on the side surface of the aperture and includes organic molecules, and an embedded film disposed in the aperture to substantially fill the aperture.

First Embodiment

First, the first embodiment will be explained.

Figure 1:
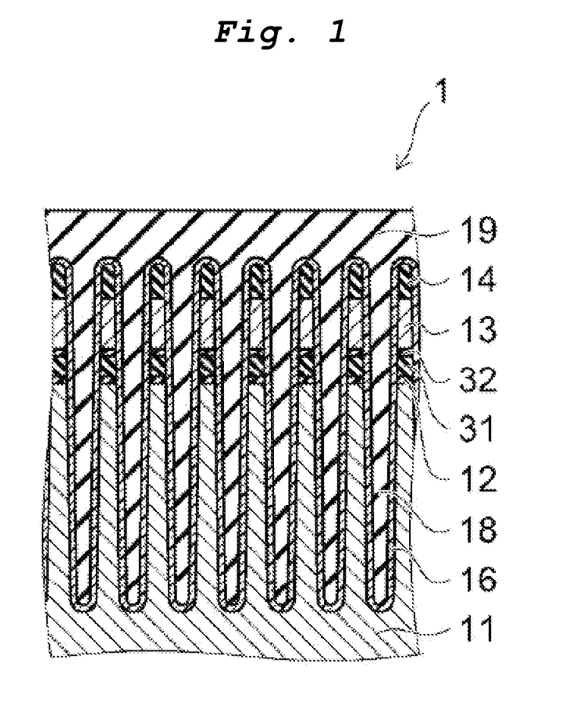
FIG. 1 is a cross section showing the semiconductor device of a first embodiment.

FIG. 1 is a cross section showing the semiconductor device of the first embodiment.

As shown in FIG. 1, a substrate 11 such as silicon is disposed on a semiconductor device 1. An insulating layer 12 is disposed on the substrate 11. The insulating layer 12 includes, for example, a silicon oxide. The insulating layer functions, for example, as a tunnel oxide film. An insulating layer 31 is disposed on the insulating layer 12. The insulating layer 31 includes, for example, a silicon nitride. The insulating layer 31 functions, for example, as a charge storage film. An insulating layer 32 is disposed on the insulating layer 31. The insulating layer 32 includes, for example, an aluminum oxide. The insulating layer 32 functions, for example, as a block insulating film.

A conductive layer 13 is disposed on the insulating layer 32. The conductive layer 13 includes, for example, polysilicon. The conductive layer 13 functions, for example, as a control gate electrode. A hard mask 14 is disposed on the conductive film 13. The hard mask 14 includes, for example, a silicon nitride. Therefore, the upper layers of the semiconductor device 1 contain materials different from the materials included in the lower layers of the semiconductor device 1 disposed on the substrate 11.

In addition, in the semiconductor device 1, several insulating layers 18 that are disposed on the upper surface of the hard mask 14, extend through the hard mask 14, conductive layer 13, insulating layer 32, insulating layer 31, and insulating layer 12 to the substrate 11. The insulating layers 18 include, for example, silicon oxide. An embedded film 19 is disposed on the insulating layers 18 and the hard mark 14. The embedded film 19 includes, for example, a silicon oxide. The insulating layers 18 and the embedded film 19 are integrated.

A monomolecular film (which is a self-assembled monolayer: SAM) 16 is disposed on portions of the insulating layers 18, the embedded film 19, the substrate 11, insulating layer 12, insulating layer 31, insulating layer 32, conductive layer 13, and hard mask 14.

Figure 2:
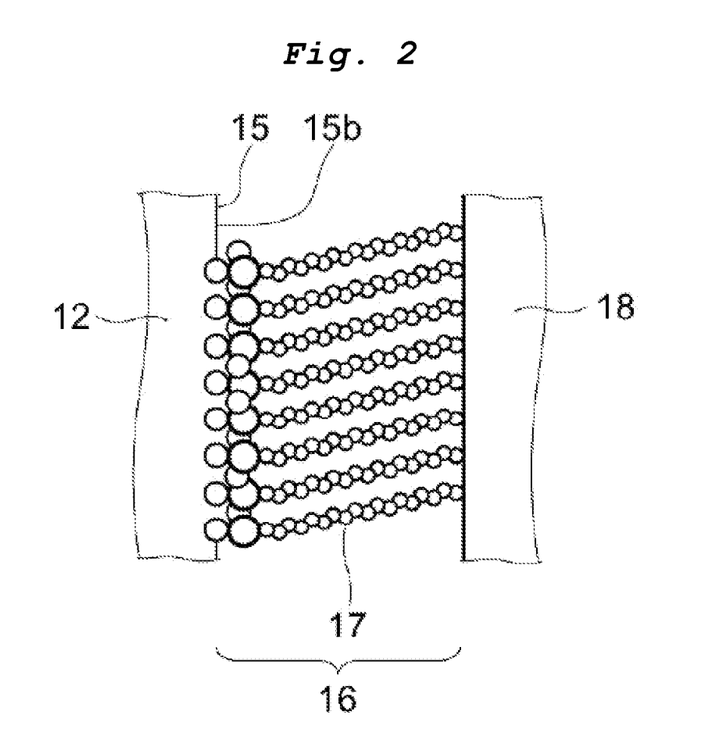
FIG. 2 illustrates a monomolecular film.

FIG. 2 illustrates a monomolecular film.

As shown in FIG. 2, the monomolecular film 16 includes organic molecules 17, for example, an alkylsilane. First ends of the organic molecules 17 in the monomolecular film 16 contact any of the substrate 11, insulating layer 12, insulating layer 31, insulating layer 32, conductive layer 13, and hard mask 14, for example, insulating layer 12. The other ends of the organic molecules 17 contact any of the insulating layers 18 and the embedded film 19, for example, insulating layers 18. The organic molecules 17 include straight chains of connected carbon atoms. The straight chains are formed by connecting 8 atoms or more, preferably 18 or more of carbon atoms in a straight chain shape. The thickness of the monomolecular film 16 may be, for example, 2.2-2.5 nm.

The insulating layers 18 in the semiconductor device 1 function as element isolation layers that divide and insulate the upper portion of the substrate 11 between the insulating layers 18, insulating layer 12, insulating layer 31, insulating layer 32, conductive layer 13, and hard mask 14 from the other portions.

Next, the method for manufacturing the semiconductor device of the first embodiment will be explained.

Figure 3A:
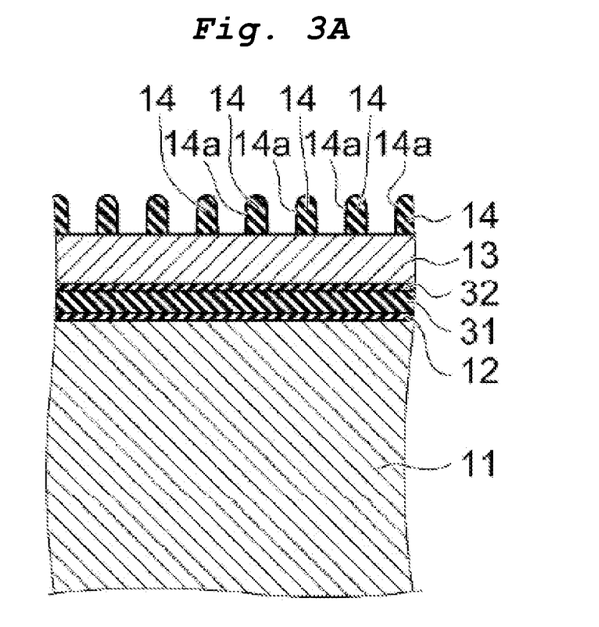
FIG. 3A to FIG. 3C are cross sections showing the method for manufacturing the semiconductor device of the first embodiment.
Figure 3B:
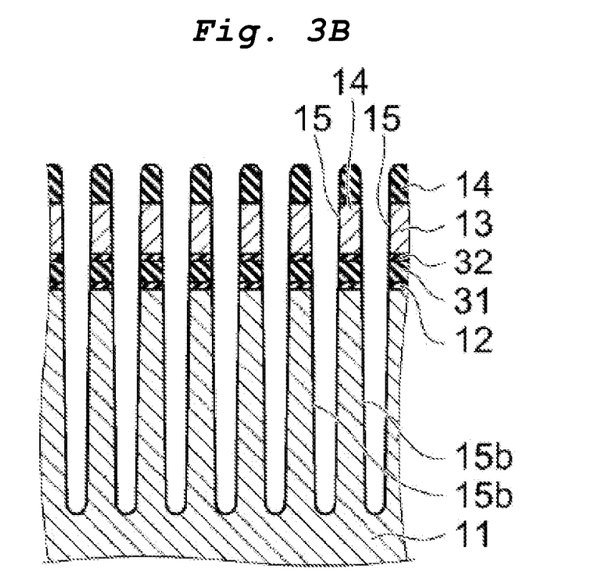
Figure 3C:
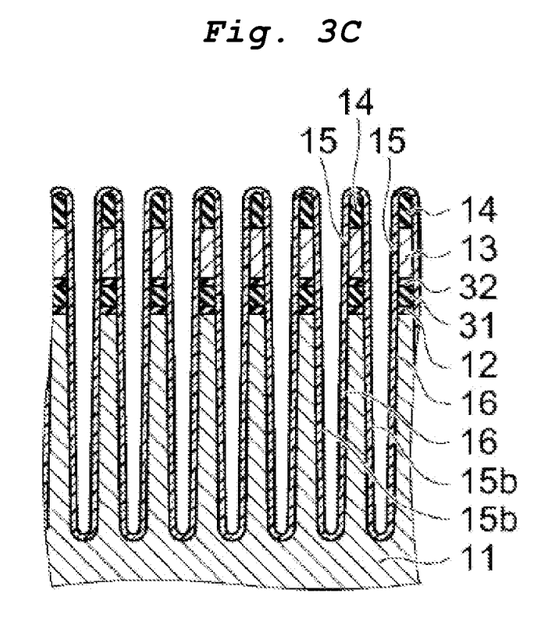

FIG. 3A to FIG. 3C are process cross sections showing the method for manufacturing the semiconductor device of the first embodiment.

As shown in FIG. 3A, the substrate 11, for example, a silicon substrate, is prepared for processing. Next, the insulating layer 12 is formed on the substrate 11. The insulating layer 12 includes, for example, a silicon oxide. The insulating layer 31 is then formed on the insulating layer 12. The insulating layer 31 includes, for example, a silicon nitride. The insulating layer 32 is then formed on the insulating layer 31. The insulating layer 32 includes an aluminum oxide.

Next, the conductive layer 13 is formed on the insulating layer 32. The conductive layer 13 includes, for example, polysilicon. The hard mask 14 is formed on the conductive layer 13. The hard mask 14 includes, for example, a silicon nitride. Therefore, the layers formed in the upper layer contain materials different from the materials included in the lower layer. The hard mask 14 includes several opening portions 14a extending in one direction on the upper surface of the substrate 11.

Next, as shown in FIG. 3B, etching is carried out using the hard mask 14 as a mask to form apertures 15 that penetrate through the conductive layer 13, insulating layer 32, insulating layer 31, and insulating layer 12 and extend to the inside of the substrate 11. The hard mask 14, conductive layer 13, insulating layer 12, and substrate 11 are exposed to side surfaces 15b (also shown in FIG. 2) of the apertures 15.

Next, as shown in FIG. 3C, the monomolecular films (self-assembled monolayer: SAM) 16 are formed on the side surfaces 15b of the apertures 15. The monomolecular films 16, for example, are formed by the following method using a liquid phase process.

First, the side surfaces 15b of the apertures 15 are oxidized with oxygenated water ($H_2O_2$). Therefore, hydroxyl groups (OH groups) are formed on the side surfaces 15b of the apertures 15. Next, a solution containing the organic molecules 17 illustrated in FIG. 2, for example, an alkylsilane or other organosilane is spread onto the substrate 11 so that the side surfaces 15b of the apertures 15 are covered by a material in contact with the hard mask 14, conductive layer 13, insulating layer 32, insulating layer 31, insulating layer 12, and substrate 11. The alkylsilane includes straight chains. The straight chains are formed by connecting 8 pieces or more, preferably 18 pieces or more of carbon molecules in a straight chain shape.

The organic molecules 17 extending to the side surfaces 15b of the apertures 15 undergo a chemical reaction, for example, a silane coupling reaction, with the side surfaces 15b of the apertures 15 and are adsorbed to the side surfaces 15b of the apertures 15. The organic molecules 17, for example, react with hydroxyl groups (OH groups) of the insulating layer 12 on the side surfaces 15b of the apertures 15 and are fixed to the insulating layer 12 on the side surfaces 15b of the apertures 15. In such an example embodiment, the monomolecular films 16 are formed using the hydroxyl groups (OH groups) present on side surfaces 15b as base points.

An intermolecular force acts between the straight chain portions of the adjacent organic molecules 17. The organic molecules 17 are mutually, densely gathered by the intermolecular force of the organic molecules 17 and arranged along the side surfaces 15b of the apertures 15.

In embodiments in which the hard mask 14 and the insulating layer 31 include a silicon nitride, hydroxyl groups on the side surfaces of the hard mask 14 and the insulating layer 31 may be fewer than those on the side surfaces of the insulating layer 12 and the substrate 11. Therefore, there are a few organic molecules 17 for causing a chemical reaction between the hard mask 14 and the insulating layer 31 on the side surfaces 15b of the apertures 15.

However, the array of the organic molecules 17 is extended along the side surfaces 15b of the apertures 15 by the intermolecular force of the organic molecules 17. Therefore, the organic molecules 17 extend to exposed portions of the hard mask 14, insulating layer 32, and the insulating layer 31 as well as the exposed portion of the insulating layer 12 and the substrate 11.

If the side surfaces 15b of the apertures 15 are covered with the organic molecules 17 and there is no room for the array of the organic molecules 17 on the side surfaces 15b of the apertures 15, the growth of the array of the organic molecules 17 on side surface 15b stops. Consequently, organic molecules 17 form the monomolecular films 16 on the side surfaces 15b of the apertures 15, as opposed to a film that is thicker than the monomolecular film 16. The straight chain portions of the organic molecules 17 in the monomolecular film 16 are attached to the side surfaces 15b of the apertures 15.

Next, the solution containing the organic molecules 17 that have not contributed to the reaction is removed. The thickness of the monomolecular films 16 depends upon the length of the organic molecules 17.

In this manner, as shown in FIG. 3C, the monomolecular films 16 in which the orientation of the organic molecules 17 is aligned are formed on the side surfaces 15b of the apertures 15.

Next, as shown in FIG. 1, for example, a silicon oxide film is formed as the embedded film 19 on the monomolecular films 16 so that it is embedded into the apertures 15. The embedded film 19, for example, is formed by a CVD method. In embodiments in which an embedded film with high affinity for the monomolecular films 16 is selected as the embedded film 19, the embedded film 19 can be embedded into the apertures 15. The portions embedded into the apertures 15 in the embedded film 19 become the insulating layers 18. In this manner, as shown in FIG. 1, the semiconductor device 1 can be manufactured.

Next, the method for controlling embedding of the film by the affinity of the monomolecular films 16 and the embedded film 19 will be explained.

Figure 4A:
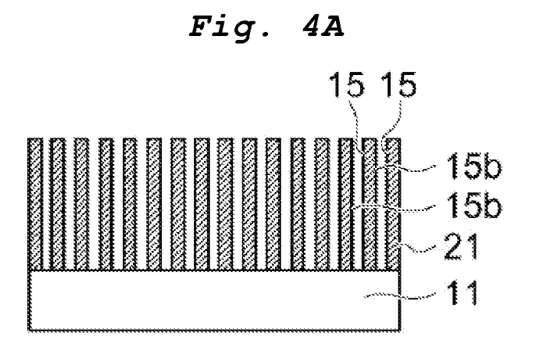
FIG. 4A to FIG. 4C are cross sections showing the method for embedding a film into apertures.
Figure 4B:
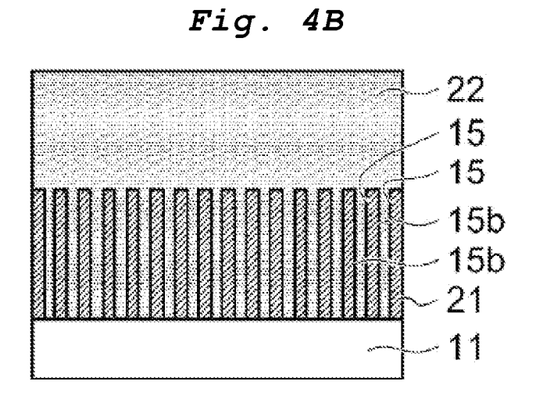
Figure 4C:
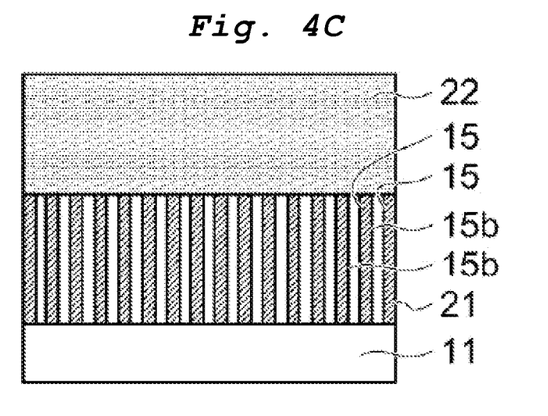

FIG. 4A to FIG. 4C are cross sections showing the method for embedding the film into apertures.

As shown in FIG. 4A, members 21 containing a single material are disposed on the substrate 11. Next, several apertures 15 extending in one direction are formed on the upper surfaces of the members 21. A single material is exposed to the side surfaces 15b of the apertures 15.

As shown in FIG. 4B, to embed the film 22 containing a single material into the apertures 15 to which the single material has been exposed, the affinity of the material exposed to the side surfaces 15b of the apertures 15 and included in the embedded film 22, is considered. A film 22 containing a material with high affinity for the material exposed to the side surfaces of the apertures 15 is selected as the embedded film 22. In this case, the film 22 can be embedded into the apertures 15.

On the other hand, as shown in FIG. 4C, a film 22 containing a material with low affinity for the material exposed to the side surfaces of the apertures 15 is selected as the embedded film 22. In this case, the film 22 with low affinity is formed on the apertures 15, the film 22 does not advance into the apertures 15. The film 22 is formed on the apertures 15. Therefore, the film 22 is not embedded into the apertures 15, and air gaps 20 are formed. Thus, the affinity of the material exposed to the side surfaces 15b of the apertures 15 and the material which is included in the embedded film 22 determines whether the film 22 containing a single material is embedded into the apertures 15 or the air gaps are formed without embedding apertures.

Figure 5A:
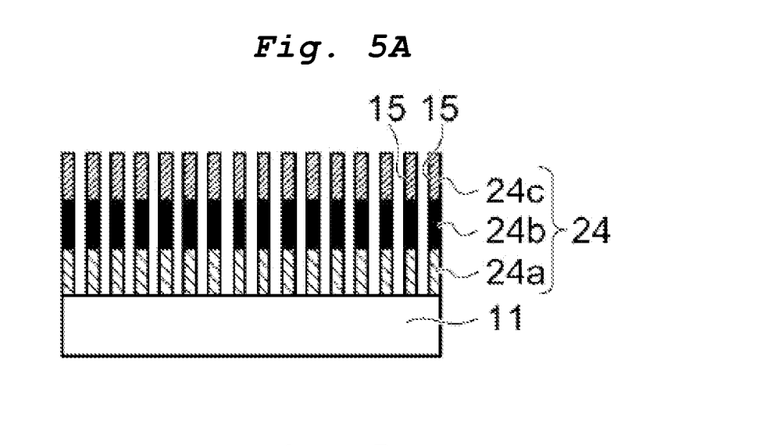
FIG. 5A and FIG. 5B are cross sections showing the method for embedding a film into apertures.
Figure 5B:
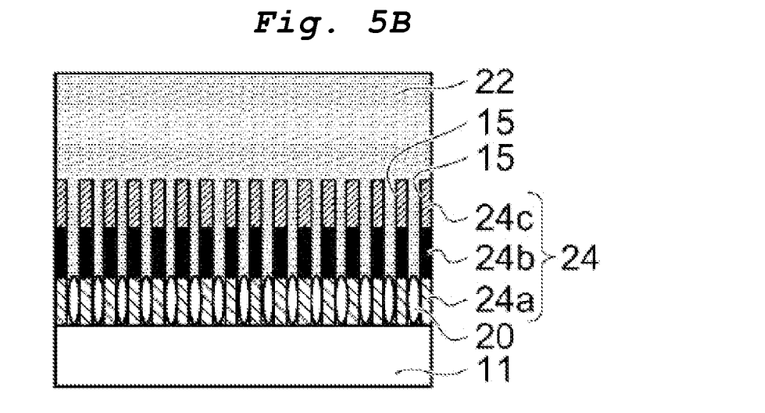

FIG. 5A and FIG. 5B are cross sections showing the method for embedding a film into the apertures.

As shown in FIG. 5A, a laminated film 24 including, in order from the bottom, layer 24a, layer 24b, and layer 24c, is formed on the substrate 11. In the laminated film 24, at least one layer, for example, the layer 24a, includes a material different from those of the other layers. The aperture 15 penetrating through the laminated film 24 is formed on the upper surface of the laminated film 24. In this case, different materials among layer 24a, layer 24b, and layer 24c are exposed to the side surface of the aperture 15.

As shown in FIG. 5B, in case the film 22 selected as the embedded film 22 is a film 22 with low affinity for the material included in the layer 24a, while the affinity for the materials included in the layers 24b and 24c is high, the portion formed in the layer 24b in the aperture 15 and the portion formed in the layer 24c can be filled with the film 22. However, it is difficult to fill the portion formed adjacent the layer 24a in the aperture 15. This phenomenon becomes increasingly apparent as the width of the aperture 15 is miniaturized and the aspect ratio of the depth of the aperture to the width of the aperture 15 increases. Therefore, the air gaps 20 are formed in the portions formed adjacent the layer 24a in the apertures 15.

Figure 6A:
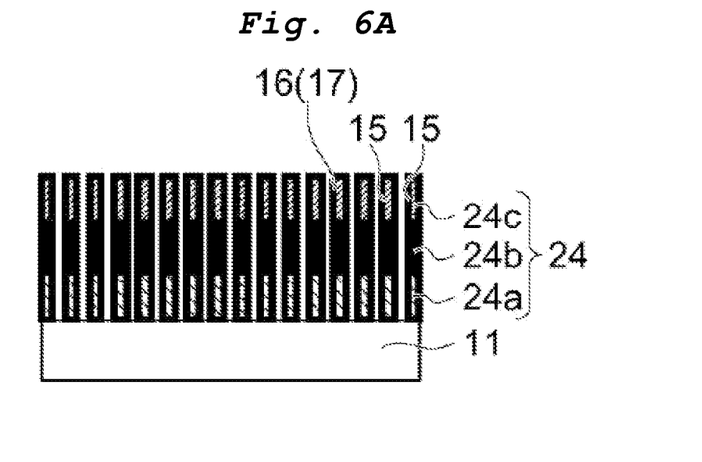
FIG. 6A and FIG. 6B are cross sections showing the method for embedding a film into apertures.
Figure 6B:
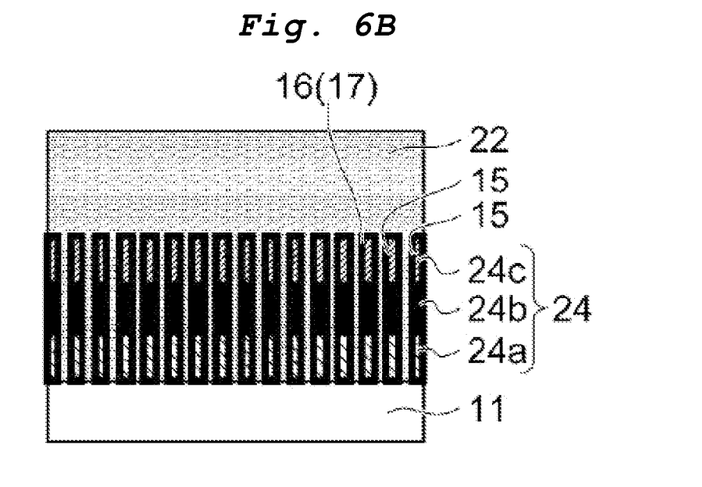
Figure 7A:
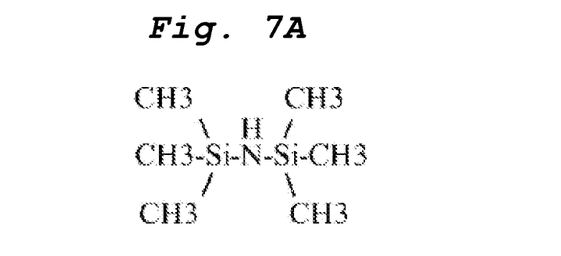
FIG. 7A to FIG. 7D are structural formulas showing organic molecules for forming a monomolecular film.
Figure 7B:
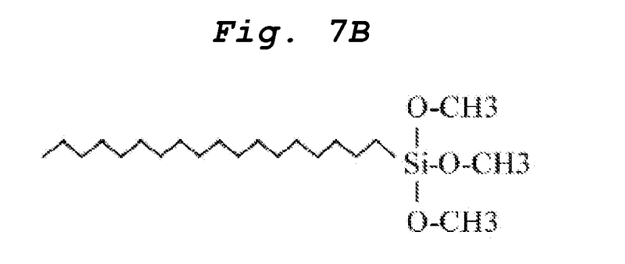
Figure 7C:
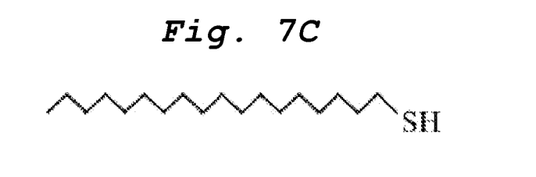
Figure 7D:
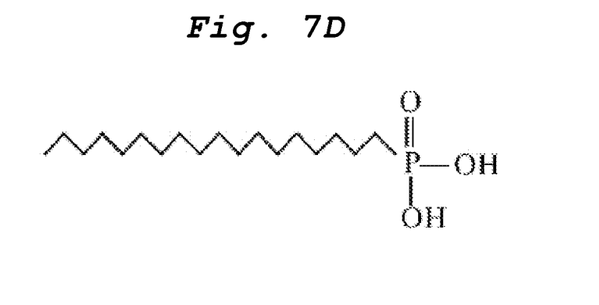

FIG. 6A and FIG. 6B are cross sections showing the method for embedding a film into the apertures.

As shown in FIG. 6A, the side surfaces 15b of the aperture 15 of the laminated film 24 are covered with the monomolecular film 16. Therefore, the materials among the portion of the layer 24b exposed to the side surface of the aperture 15, the portion of the layer 24c, and the portion of the layer 24a are different, and even if the affinity for the embedded film 22 is different, embedding of the embedded film 22 is controlled by the affinity for the organic molecules 17.

As shown in FIG. 6B, with the selection of the organic molecules 17 which are included in the monomolecular films 16, and the film 22 containing a material with high affinity for the organic molecules 17, the film 22 can be embedded into the apertures 15.

According to this embodiment, the side surfaces 15b of the apertures, to which different kinds of materials with different affinity, for example, wettability and water repellency are exposed, are covered with the monomolecular films 16, thus being able to make the affinity for the embedded film 22 uniform. Therefore, even if the apertures 15 are miniaturized, the embedded film 22 can be embedded into the apertures 15. Thereby, the semiconductor device 1 can be miniaturized.

FIG. 7A to FIG. 7D are structural formulas showing the organic molecules for forming the monomolecular film.

As shown in FIG. 7A to FIG. 7D, to control the affinity of the embedded film 19 and the side surfaces 15b of the apertures 15, as the organic molecules for forming the monomolecular films that cover the side surfaces 15b of the apertures 15, hexamethyldisilane (HMDS) (see FIG. 7A), octadecylsilane (see FIG. 7B), octadecanethiol (see FIG. 7C), and octadecanesulfonic acid (see FIG. 7D) can be used. For example, in embodiments in which the side surfaces 15b of the apertures 15 include hydroxyl groups (OH groups); the monomolecular films 16 may also be formed by coupling the octadecylsilane through a silane coupling reaction.

Moreover, the organic molecules included in monomolecular film 16 are not limited to alkylsilanes and the organic molecules shown in FIG. 7A to FIG. 7D. For example, in embodiments in which the side surfaces 15b of the apertures 15 include gold (Au) or platinum (Pt), the monomolecular films 16 may also be formed by using alkanethiol as the organic molecules 17. As the organic molecules 17, insulating molecules having no π bond may also be used. In addition, other well-known organic molecules 17 may also be used.

Moreover, the film 22 has been embedded into the apertures 15. However, without being limited to it, for example, the monomolecular films 16 may be formed on the side surfaces of holes, and the film 22 may be embedded into the holes. The apertures and the holes are referred to as concave portions.

Furthermore, the side surfaces of the apertures 15 have been oxidized with hydrogen peroxide. However, without being limited to it, the side surfaces may be oxidized with ozone.

In addition, the hydroxyl groups have been formed on the side surfaces of the apertures 15. However, without being limited to it, amino groups may also be formed.

To form the monomolecular films 16, the solution of the organic molecules 17 has been spread on the substrate 11. However, without being limited to it, the substrate 11 may also be immersed into a solution containing the organic molecules 17. In addition, the monomolecular films 16 may also be formed by an ALD method.

The silicon oxide film has been used as the embedded film 19; however the embedded film 19 is not limited to the insulating film. A metal film may also be embedded.

The embedded film may be embedded into the apertures by the CVD method. However, without being limited to it, any of a sputtering method, a vacuum deposition method, a PLD method, a MBE method, and a liquid-phase spreading may also be employed.

Modified Example of the Embodiment

Next, a modified example of the embodiment will be explained.

In this modified example, the film is not embedded into the apertures, and embedding of the film is controlled by the monomolecular films so that air gaps may be formed in the apertures.

Figure 8:
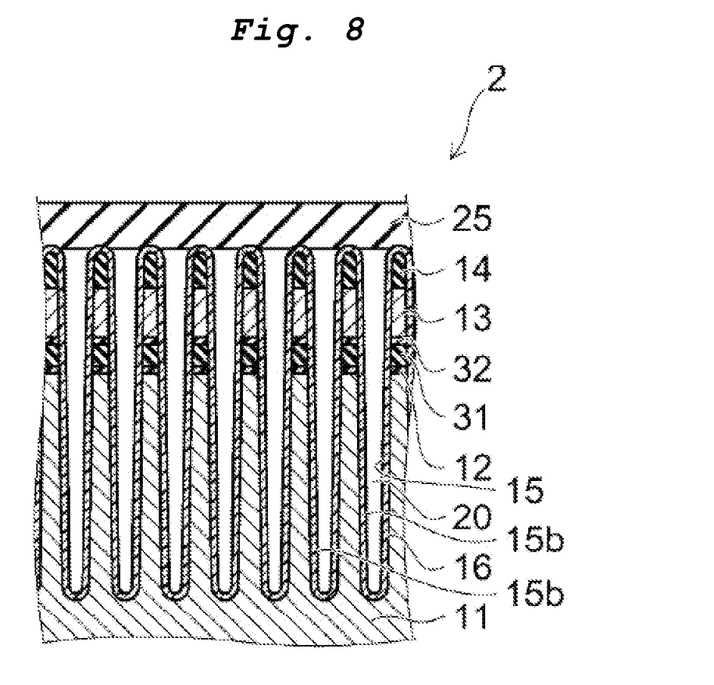
FIG. 8 is a cross section showing the semiconductor device of a second embodiment.

FIG. 8 is a cross section showing the semiconductor device of the second embodiment.

As shown in FIG. 8, the substrate 11, for example, a silicon substrate is disposed in a semiconductor device 2. The insulating layer 12 is disposed on the substrate 11. The insulating layer 12 includes, for example, a silicon oxide. The insulating layer 31 is disposed on the insulating layer 12. The insulating layer 31 includes, for example, a silicon nitride. The insulating layer 32 is disposed on the insulating layer 31. The insulating layer 32 includes, for example, an aluminum oxide.

The conductive layer 13 is disposed on the insulating layer 32. The conductive layer 13 includes, for example, polysilicon. The hard mask 14 is disposed on the conductive film 13. The hard mask 14 includes, for example, a silicon nitride. A film 25 is disposed on the hard mask 14. Therefore, layers containing materials different from the materials included in the lower layer are arranged in the upper layer on the substrate 11.

In addition, several air gaps 20, which extend in one direction, in a surface parallel with the upper surface of the hard mask 14, penetrate through the hard mask 14, conductive layer 13, insulating layer 32, insulating layer 31, and insulating layer 12 and extend to the substrate 11, are formed in the semiconductor device 2.

The monomolecular film (self-assembled monolayer: SAM) 16 is disposed among the air gaps 20 and the film 25, the substrate 11, insulating layer 12, insulating layer 31, insulating layer 32, conductive layer 13, and hard mask 14. The monomolecular films 16 include the organic molecules 17. First ends of the organic molecules 17 in the monomolecular films 16 contact the side surfaces 15b of the apertures 15. The other ends of the organic molecules 17 are exposed to the air gaps 20 or contact the film 25. Other elements of the semiconductor device 2 other than those described in this embodiment are generally similar to those of the first embodiment, i.e., the semiconductor device 1 in FIG. 1.

Next, the method for manufacturing the semiconductor device of this modified example will be explained.

First, similar to the first embodiment, the processes shown in FIG. 3A and FIG. 3B are applied. The explanation of these processes is omitted.

Next, the monomolecular films 16 are formed on the side surfaces 15b of the apertures 15. In this modified example, as the monomolecular films 16, the monomolecular films 16 are formed that have low affinity for the material included in the film 25. The monomolecular films 16 are formed, for example, by the method using a liquid phase.

Next, as shown in FIG. 1, the film 25, for example, a silicon oxide film, is formed on the apertures 15. The film 25 is formed, for example, by the CVD method. In embodiments in which a film with low affinity for the monomolecular films 16 is used as the film 25, the film 25 is not embedded into the apertures 15, and air gaps 20 are formed. In this manner, as shown in FIG. 8, the semiconductor device 2 can be manufactured.

In this modified example, a film containing organic molecules 17 with low affinity for the material in the film 25, is used as the monomolecular film 16. Therefore, air gaps 20 can be formed in the apertures 15. In this manner, the embedding method of the film 25 can be controlled by the affinity of the monomolecular films 16 and the film 25.

In the second embodiment and modified example, the case where NAND type flash memories having a laminated film in which the tunnel oxide film (insulating film 12), charge storage film (insulating film 31), block oxide film (insulating film 32), control electrode (conductive film 13), and hard disk 14 are laminated in this sequence, are assumed to include the semiconductor devices 1 and 2. In such embodiments, a film embedded in STI (shallow trench isolation) has been shown as an example. However, without being limited to it, for example, a gate-like structure having a laminated film in which a gate insulating film and a gate electrode film are laminated, a film may be embedded between different kinds of laminated films. In addition, an arbitrary semiconductor device in which a film is embedded between different kinds of laminated films can be adopted.

According to the embodiments explained above, the film embedding method and the semiconductor device, which can realize miniaturization, can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of forming an embedded film, the method comprising:
depositing a first layer on a second layer, the second layer being disposed above a substrate and including a material different from materials included in the first layer;
forming an aperture through the first layer and into the second layer, the aperture having a side surface that includes an exposed portion of the first layer and an exposed portion of the second layer;
covering the side surface of the aperture with a monomolecular film that contains a material that includes organic molecules; and
embedding a material in the aperture so as to substantially fill the aperture and form the embedded film.

2. The film embedding method of claim 1, wherein said material embedded in the aperture has a high enough affinity to the self-assembled monolayer to cause the material to substantially fill the aperture.

3. The film embedding method of claim 1, wherein the monomolecular film is formed by subjecting the organic molecules and at least one of the exposed portion of the first layer and the exposed portion of the second layer to a silane coupling reaction.

4. The film embedding method of claim 1, wherein the monomolecular film is formed by forming one of hydroxyl (OH) groups and amino groups on the side surface and then subjecting the organic molecules and at least one of the exposed portion of the first layer and the exposed portion of the second layer to a silane coupling reaction.

5. The film embedding method of claim 4, wherein the hydroxyl groups are formed on the side surface using one of hydrogen peroxide ($H_2O_2$) and ozone ($O_3$).

6. The film embedding method of claim 4, wherein the hydroxyl groups are formed on the side surface using a liquid phase process.

7. The film embedding method of claim 1, wherein the organic molecules comprise an alkylsilane.

8. The film embedding method of claim 1, wherein the organic molecules comprise one or more molecules selected from the group of organosilanes consisting of hexamethyldisilane, octadecylsilane, octadecanethiol, and octadecanesulfonic acid.

9. The film embedding method of claim 1, wherein the monomolecular film comprises a self-assembled monolayer.

10. The film embedding method of claim 1, wherein the organic molecules include straight chains in which carbon atoms are connected.

11. The film embedding method of claim 1, wherein the first layer and the second layer have a different affinity to the embedded film.

12. The film embedding method of claim 1, wherein the first layer and the second layer have a lower affinity to the embedded film than the monomolecular film.

13. A semiconductor device, comprising:
a first layer disposed on a second layer being disposed above a substrate and including a material different from materials included in the first layer, the first layer and the second layer having an aperture that is formed through the first layer and into the second layer and has a side surface in contact with a portion of the first layer and a portion of the second layer;

a monomolecular film that is formed on the side surface of the aperture and includes organic molecules; and an embedded film disposed on the monomolecular film to substantially fill the aperture.

14. The semiconductor device of claim 13, wherein embedded film comprises a silicon oxide film.

15. The semiconductor device of claim 13, wherein the organic molecules comprise an alkylsilane.

16. The semiconductor device of claim 13, wherein the organic molecules comprise one or more molecules selected from the group of organosilanes consisting of hexamethyldisilane, octadecylsilane, octadecanethiol, and octadecanesulfonic acid.

17. The semiconductor device of claim 13, wherein the monomolecular film comprises a self-assembled monolayer.

18. The semiconductor device of claim 13, wherein the organic molecules include straight chains of connected carbon atoms.

19. The semiconductor device of claim 13, wherein the first layer and the second layer have a different affinity to the embedded film.

20. The semiconductor device of claim 13, wherein the first layer and the second layer have a lower affinity to the embedded film than the monomolecular film.

* * * * *